US011374093B2

(12) United States Patent
Huang et al.

(10) Patent No.: US 11,374,093 B2
(45) Date of Patent: Jun. 28, 2022

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Lin-Yu Huang, Hsinchu (TW); Li-Zhen Yu, New Taipei (TW); Cheng-Chi Chuang, New Taipei (TW); Kuan-Lun Cheng, Hsinchu (TW); Chih-Hao Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/104,395

(22) Filed: Nov. 25, 2020

(65) Prior Publication Data

US 2022/0165846 A1 May 26, 2022

(51) Int. Cl.
*H01L 29/06* (2006.01)
*H01L 29/417* (2006.01)
(Continued)

(52) U.S. Cl.
CPC ...... *H01L 29/0847* (2013.01); *H01L 29/0649* (2013.01); *H01L 29/6653* (2013.01); *H01L 29/6656* (2013.01)

(58) Field of Classification Search
CPC ......... H01L 21/02603; H01L 21/28141; H01L 21/486; H01L 21/764; H01L 21/768; H01L 21/76802; H01L 21/7682; H01L 21/76831; H01L 21/823431; H01L 21/823475; H01L 21/823821; H01L 21/823871; H01L 21/845; H01L 27/0886; H01L 27/0924; H01L 27/10879; H01L 27/1211; H01L 29/0649; H01L 29/0653; H01L 29/0665; H01L 29/0669; H01L 29/0673; H01L 29/0847; H01L 29/41791; H01L 29/66439; H01L 29/66795; H01L 29/775; H01L 29/785; H01L 29/7851; H01L 29/7853; H01L 29/7855; H01L 2029/7858;
(Continued)

(56) References Cited

U.S. PATENT DOCUMENTS 9,105,490 B2 8/2015 Wang et al.
9,236,267 B2 1/2016 De et al.
(Continued)

*Primary Examiner* — David C Spalla
(74) *Attorney, Agent, or Firm* — NZ Carr Law Office

(57) ABSTRACT

A semiconductor device structure, along with methods of forming such, are described. The structure includes a substrate, a source/drain contact disposed over the substrate, a first dielectric layer disposed on the source drain contact, an etch stop layer disposed on the first dielectric layer, and a source/drain conductive layer disposed in the etch stop layer and the first dielectric layer. The structure further includes a spacer structure disposed in the etch stop layer and the first dielectric layer. The spacer structure surrounds a sidewall of the source/drain conductive layer and includes a first spacer layer having a first portion and a second spacer layer adjacent the first portion of the first spacer layer. The first portion of the first spacer layer and the second spacer layer are separated by an air gap. The structure further includes a seal layer.

20 Claims, 17 Drawing Sheets

(51) Int. Cl.
  *H01L 29/66* (2006.01)
  *H01L 29/78* (2006.01)
  *H01L 21/8234* (2006.01)
  *H01L 29/08* (2006.01)

(58) Field of Classification Search
  CPC . H01L 23/481; H01L 23/49827; H01L 23/52; H01L 23/522; H01L 23/5226; H01L 23/5329
  See application file for complete search history.

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2018/0166319 A1* | 6/2018 | Park ................ H01L 29/6653 |
| 2018/0233398 A1* | 8/2018 | Van Cleemput ............ H01L 21/02175 |
| 2019/0296123 A1* | 9/2019 | Lee ................ H01L 21/02167 |
| 2019/0334008 A1* | 10/2019 | Chen ................ H01L 29/4991 |
| 2020/0020697 A1* | 1/2020 | Kim ................ H01L 27/10888 |
| 2020/0403034 A1* | 12/2020 | Ando ................ H01L 45/146 |

* cited by examiner

SEMICONDUCTOR DEVICE STRUCTURE AND METHODS OF FORMING THE SAME

BACKGROUND

Device scaling, which has driven the semiconductor technology for decades, increases not only transistor density, but also that of the metal interconnects. As the semiconductor industry introduces new generations of integrated circuits (ICs) with higher performance and more functions, the density of components forming the ICs has increased, while the dimensions, sizes, and spacing between components or elements have decreased.

The main purpose of continuous scaling of the device dimensions is to improve the performance of the semiconductor microprocessors and to pack more devices in the same area. However, as the technology node is advanced, the distances between metal contacts or metal lines become much shorter and cause serious coupling capacitance and deteriorate isolation.

Therefore, there is a need to solve the above problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2a-2l are cross-sectional side views of various stages of manufacturing the semiconductor device structure taken along line A-A of FIG. 1, in accordance with some embodiments.

DETAILED DESCRIPTION

Figure 1:
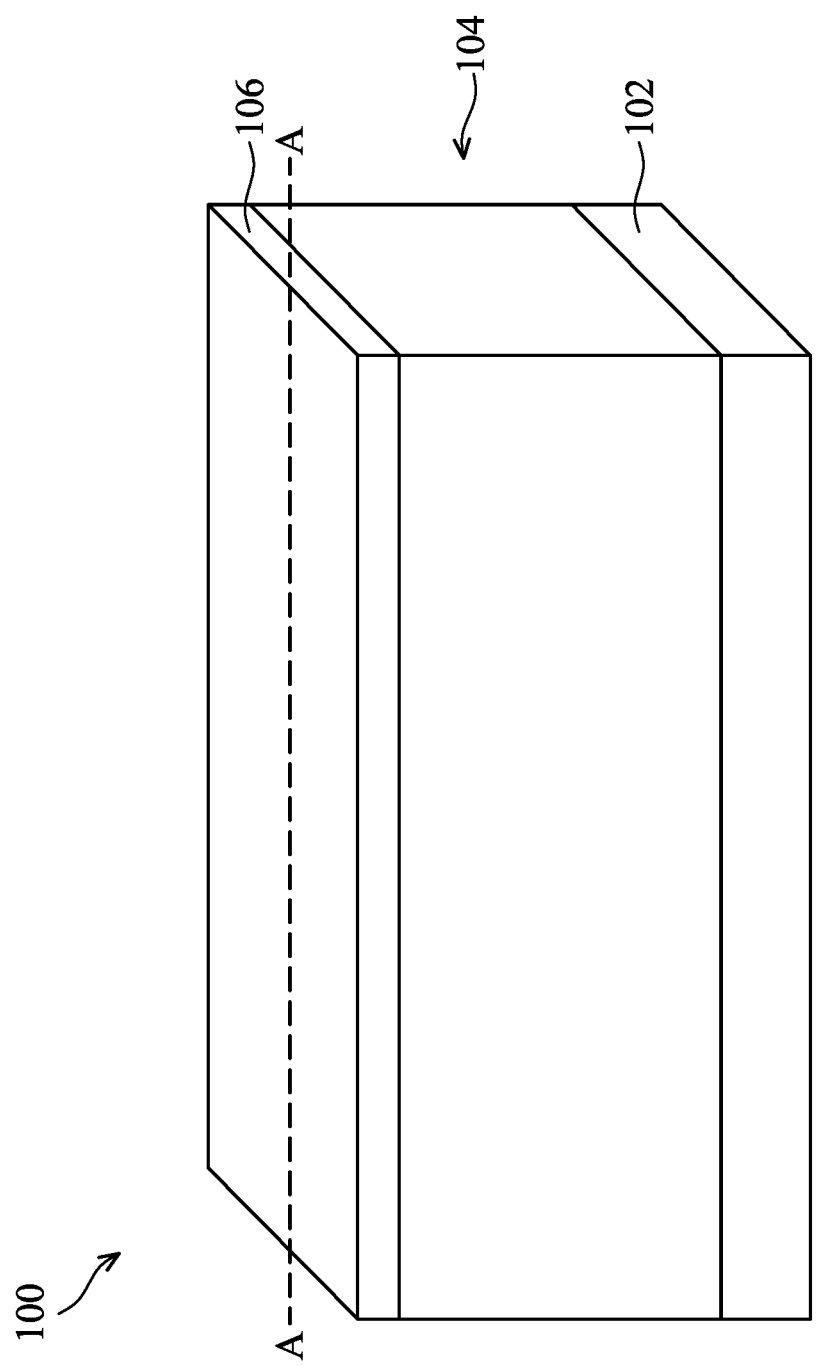
FIG. 1 is a perspective view of one of the various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-6 show exemplary sequential processes for manufacturing a semiconductor device structure, in accordance with some embodiments. It is understood that additional operations can be provided before, during, and after processes shown by FIGS. 1-6, and some of the operations described below can be replaced or eliminated, for additional embodiments of the process. The order of the operations/processes may be interchangeable.

FIG. 1 is a perspective view of one of the various stages of manufacturing a semiconductor device structure 100, in accordance with some embodiments. As shown in FIG. 1, the semiconductor device structure 100 includes a substrate 102, one or more devices 104 formed over the substrate 102, and an etch stop layer 106 formed over the one or more devices 104. The one or more devices 104 may be one or more semiconductor devices, such as transistors, diodes, imaging sensors, resistors, capacitors, inductors, memory cells, a combination thereof, and/or other suitable devices.

Figure 2A:
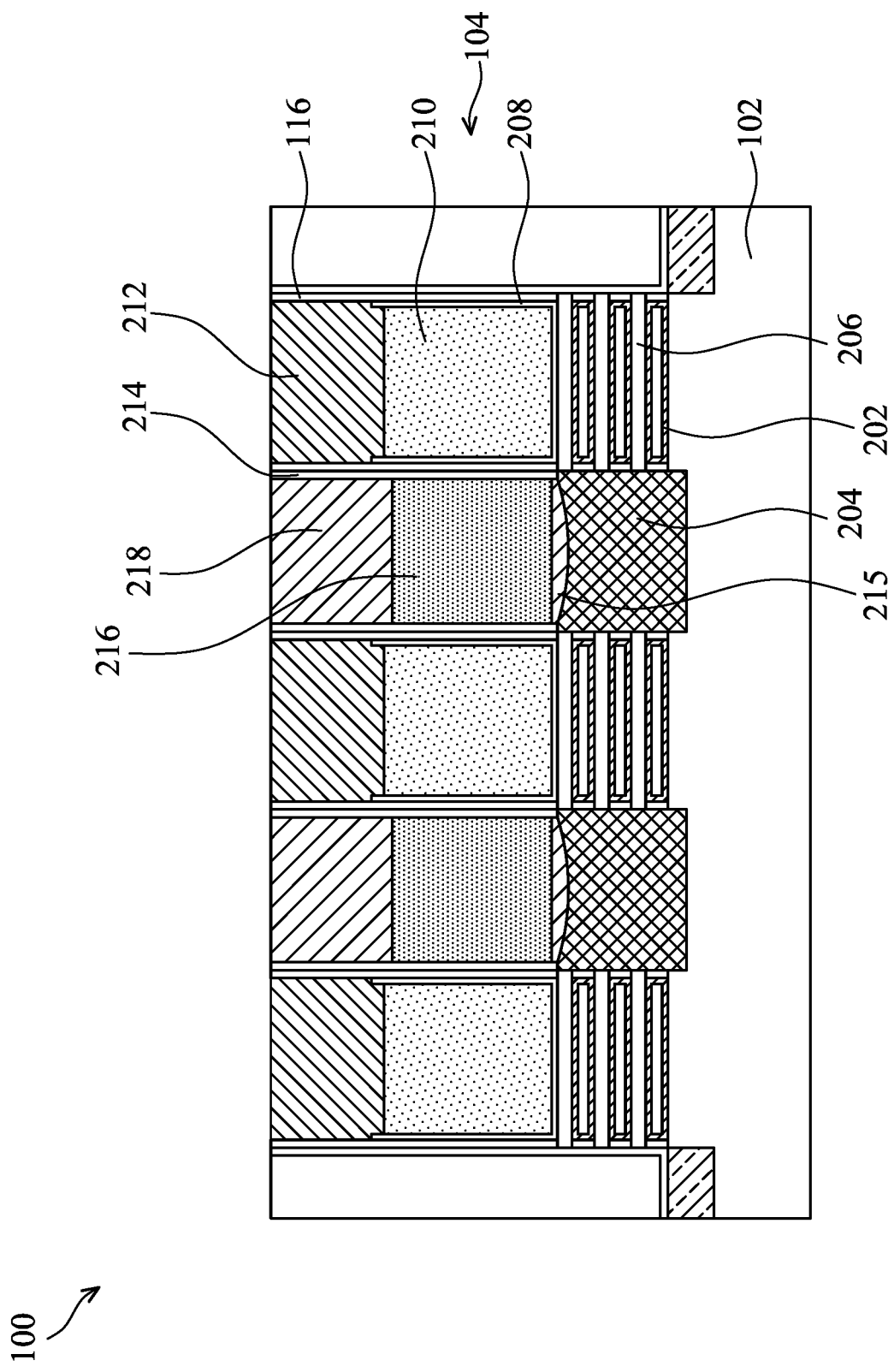

FIG. 2a-2l are cross-sectional side views of various stages of manufacturing the semiconductor device structure taken along line A-A of FIG. 1, in accordance with some embodiments. As shown in FIG. 2a, the one or more devices 104 may include source/drain (S/D) regions 204, channel regions 206, and gate stacks 202. The gate stacks 202 may be disposed between S/D regions 204, and the channel regions 206 are at least partially surrounded by the gate stacks 202. Each gate stack 202 may include a gate electrode layer 210 and one or more gate dielectric layers 208.

In some embodiments, the one or more devices 104 includes a nanosheet transistor having the nanosheet structure as shown in FIG. 2a. Nanosheet transistors may include nanowire transistors, gate-all-around (GAA) transistors, multi-bridge channel (MBC) transistors, or any transistors having the gate electrode surrounding the channel regions. Another example of the one or more devices 104 is a FinFET (not shown).

The substrate 102 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), and indium phosphide (InP). For example, the substrate 102 is made of Si. In some embodiments, the substrate 102 is a silicon-on-insulator (SOI) substrate, which includes an insulating layer (not shown) disposed between two silicon layers. In one aspect, the insulating layer is an oxygen-containing material, such as an oxide.

The substrate 102 may include one or more buffer layers (not shown) on the surface of the substrate 102. The buffer layers can serve to gradually change the lattice constant from that of the substrate to that of the source/drain regions. The buffer layers may be formed from epitaxially grown single crystalline semiconductor materials such as, but not limited to Si, Ge, germanium tin (GeSn), SiGe, GaAs, InSb, GaP, GaSb, InAlAs, InGaAs, GaSbP, GaAsSb, GaN, GaP, and InP. In one embodiment, the substrate 102 includes SiGe buffer layers epitaxially grown on the silicon substrate 102. The germanium concentration of the SiGe buffer layers may increase from 30 atomic percent germanium for the bottom-most buffer layer to 70 atomic percent germanium for the top-most buffer layer.

The substrate 102 may include various regions that have been suitably doped with impurities (e.g., p-type or n-type impurities). The dopants are, for example boron for an n-type fin field effect transistor (FinFET) and phosphorus for a p-type FinFET.

The gate electrode layers 210 and the S/D contacts 216 are separated by the spacers 116. As shown in FIG. 2a, the gate dielectric layers 208 are formed around each channel region 206, and the gate electrode layers 210 are formed on the gate dielectric layers 208, surrounding a portion of each channel region 206. The gate dielectric layer 208 may be formed by CVD, ALD or any suitable deposition technique. In one embodiment, the gate dielectric layer 208 is formed using a conformal deposition process such as ALD in order to ensure the formation of a gate dielectric layer having a uniform thickness. The gate electrode layer 210 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or any combinations thereof. The gate electrode layer 210 may be formed by CVD, ALD, PVD, electro-plating, or other suitable deposition technique. A first dielectric cap layer 212 is formed over the gate electrode layer 210. The first dielectric cap layer 212 may include or be formed of an oxygen-containing material, a nitrogen-containing material, or a silicon-containing material. Exemplary materials for the first dielectric cap layer 212 may include, but are not limited to, SiN, ZrSi, SiCN, ZrAlo, TiO, TaO, ZrO, LaO, ZrN, SiC, ZnO, SiOC, HfO, LaO, AlO, SiOCN, AlON, YO, TaCN, SiO, or any combinations thereof. The first dielectric cap layer 212 can be used to define self-aligned contact region and thus referred to as SAC structures.

As shown in FIG. 2a, a contact etch stop layer (CESL) 214 may be formed on each S/D region 204 between two adjacent spacers 116. The formation of the CESL 214 may include conformally forming the CESL 214 on the S/D region 204 and the sidewalls of the spacers 116, and removing portions of the CESL 214 to expose the S/D region 204. The CESL 214 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. The S/D contact 216 may be made of a material including one or more of Ru, Mo, Co, Ni. W, Ti, Ta, Cu, Al, TiN and TaN, and can be formed by CVD, ALD, electro-plating, or other suitable deposition technique.

S/D contacts 216 are formed over the S/D regions 204, and a silicide layer 215 is formed between the S/D region 204 and the S/D contact 216. The bottom of the silicide layer 215 may have a profile (e.g., a concave profile) in accordance with the profile of the upper portion of exposed S/D region 204. The silicide layer 215 conductively couples the S/D region 204 to the S/D contact 216. For n-channel FETs, the silicide layer 215 may be made of a material including one or more of TiSi, CrSi, TaSi, MoSi, ZrSi, HfSi, ScSi, Ysi, HoSi, TbSI, GdSi, LuSi, DySi, ErSi, YbSi, or combinations thereof. For p-channel FETs, the silicide layer 215 may be made of a material including one or more of NiSi, CoSi, MnSi, WSi, FeSi, RhSi, PdSi, RuSi, PtSi, IrSi, OsSi, or combinations thereof. In some embodiments, the silicide layer 215 is made of a metal or metal alloy silicide, and the metal includes a noble metal, a refractory metal, a rare earth metal, alloys thereof, or combinations thereof.

The S/D contact 216 may be made of a material including one or more of Ru, Mo, Co, Ni. W, Ti, Ta, Cu, Al, TiN and TaN, and can be formed by CVD, ALD, electro-plating, or other suitable deposition technique. While not shown, a barrier layer (e.g., TiN, TaN, or the like) may be formed on sidewalls of the contact openings prior to forming the S/D contact 216. A second dielectric cap layer 218 may be formed over the S/D contact 216. The second dielectric cap layer 218 may include or be formed of oxygen-containing materials, nitrogen-containing materials, or silicon-containing materials. Exemplary materials for the second dielectric cap layer 218 may include, but are not limited to, SiN, ZrSi, SiCN, ZrAlO, TiO, TaO, ZrO, LaO, ZrN, SiC, ZnO, SiOC, HfO, LaO, AlO, SiOCN, AlON, YO, TaCN, SiO, or any combinations thereof. The thickness of the second dielectric cap layer 218 may be 1 nm to 50 nm. In some embodiments, the second dielectric cap layer 218 may be omitted.

Figure 2B:
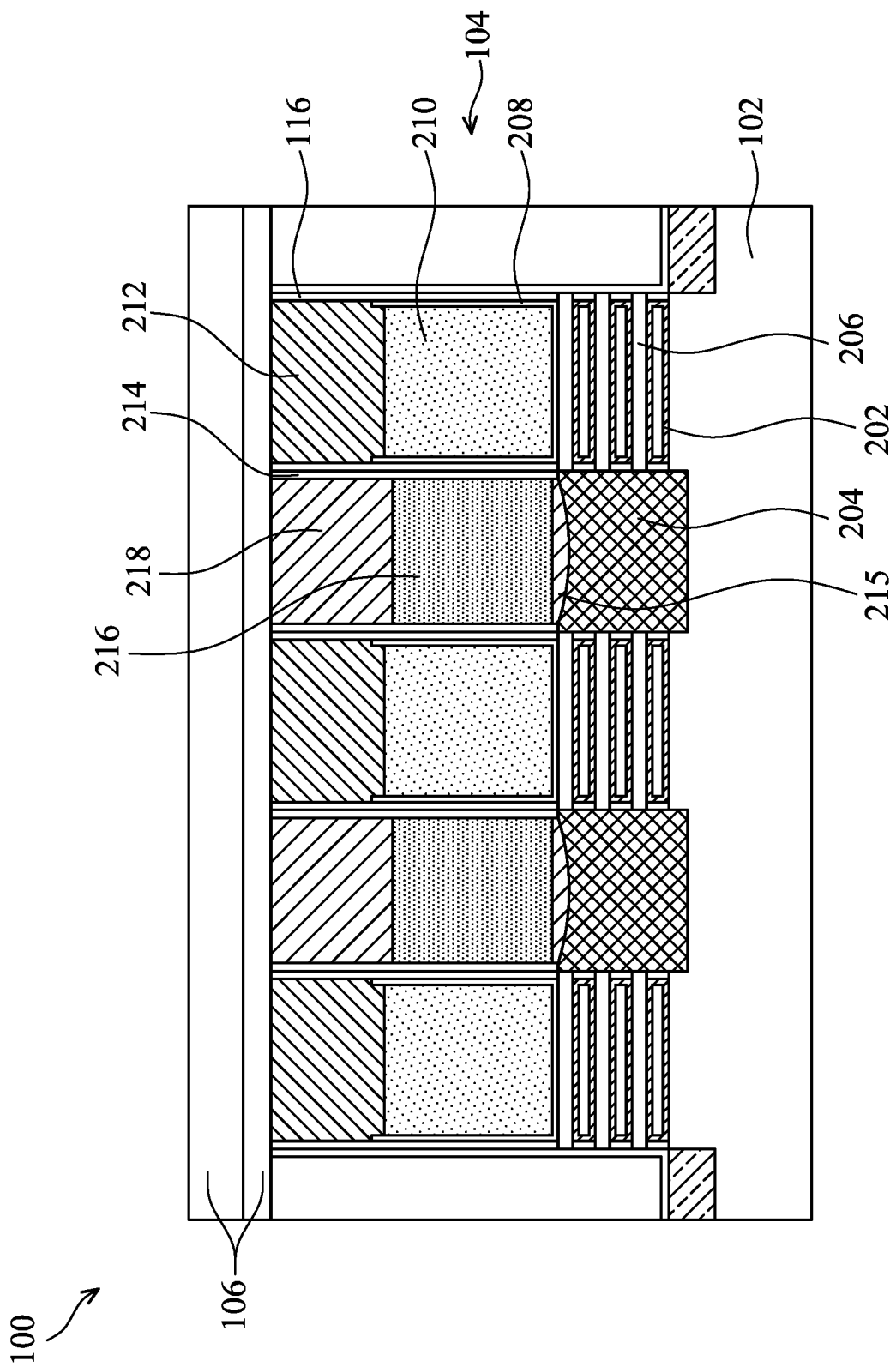

As shown in FIG. 2b, the etch stop layer 106 is formed over the first dielectric cap layer 212 and the second dielectric cap layer 218. The etch stop layer 106 may be a single layer structure, or a two-layer structure, as shown in FIG. 2b. In some embodiments, the etch stop layer 106 may include, but are not limited to, SiN, ZrSi, SiCN, ZrAlO, TiO, TaO, ZrO, LaO, ZrN, SiC, ZnO, SiOC, HfO, LaO, AlO, SiOCN, AlON, YO, TaCN, SiO, or any combinations thereof. The thickness of the etch stop layer 106 may be 1 nm to 50 nm. When the etch stop layer 106 is a two-layer structure, the thickness of each layer may be 1 nm to 50 nm.

Figure 2C:
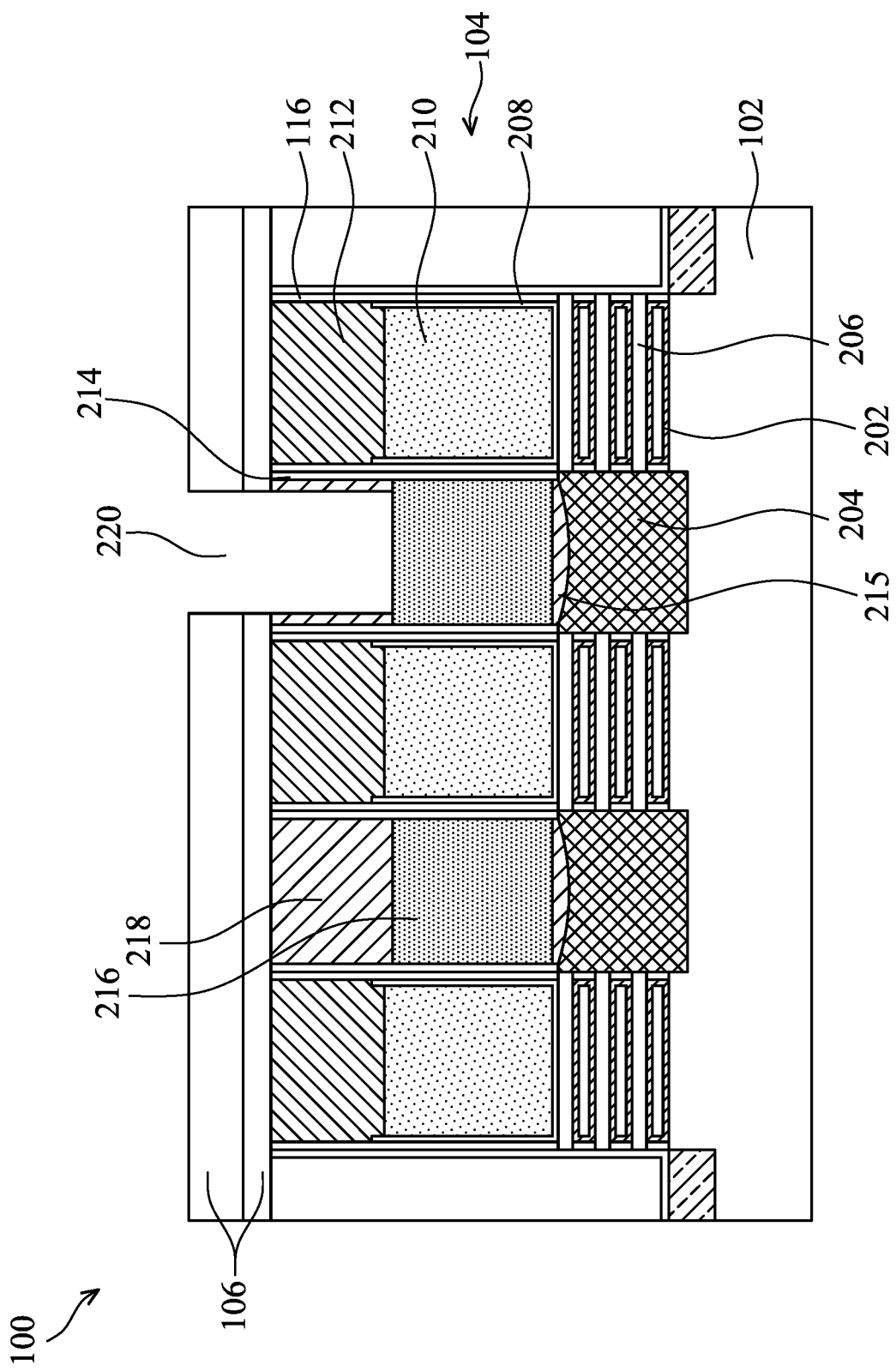

As shown in FIG. 2c, a patterning operation including photo-lithography and etching processes is performed to form the opening 220 in the second dielectric cap layer 218 and the etch stop layer 106 to expose the S/D contact 216.

Figure 2D:
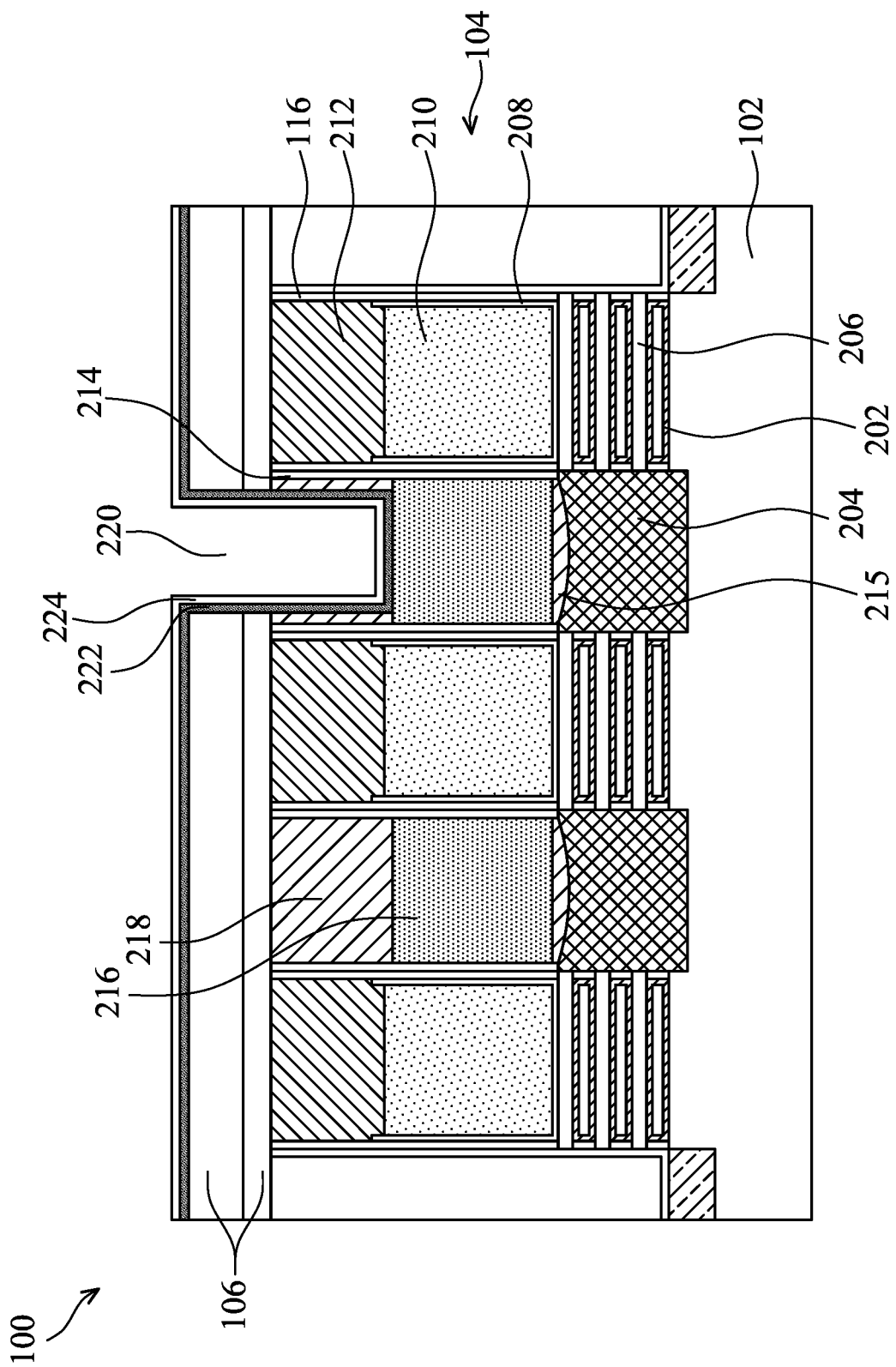
Figure 2E:
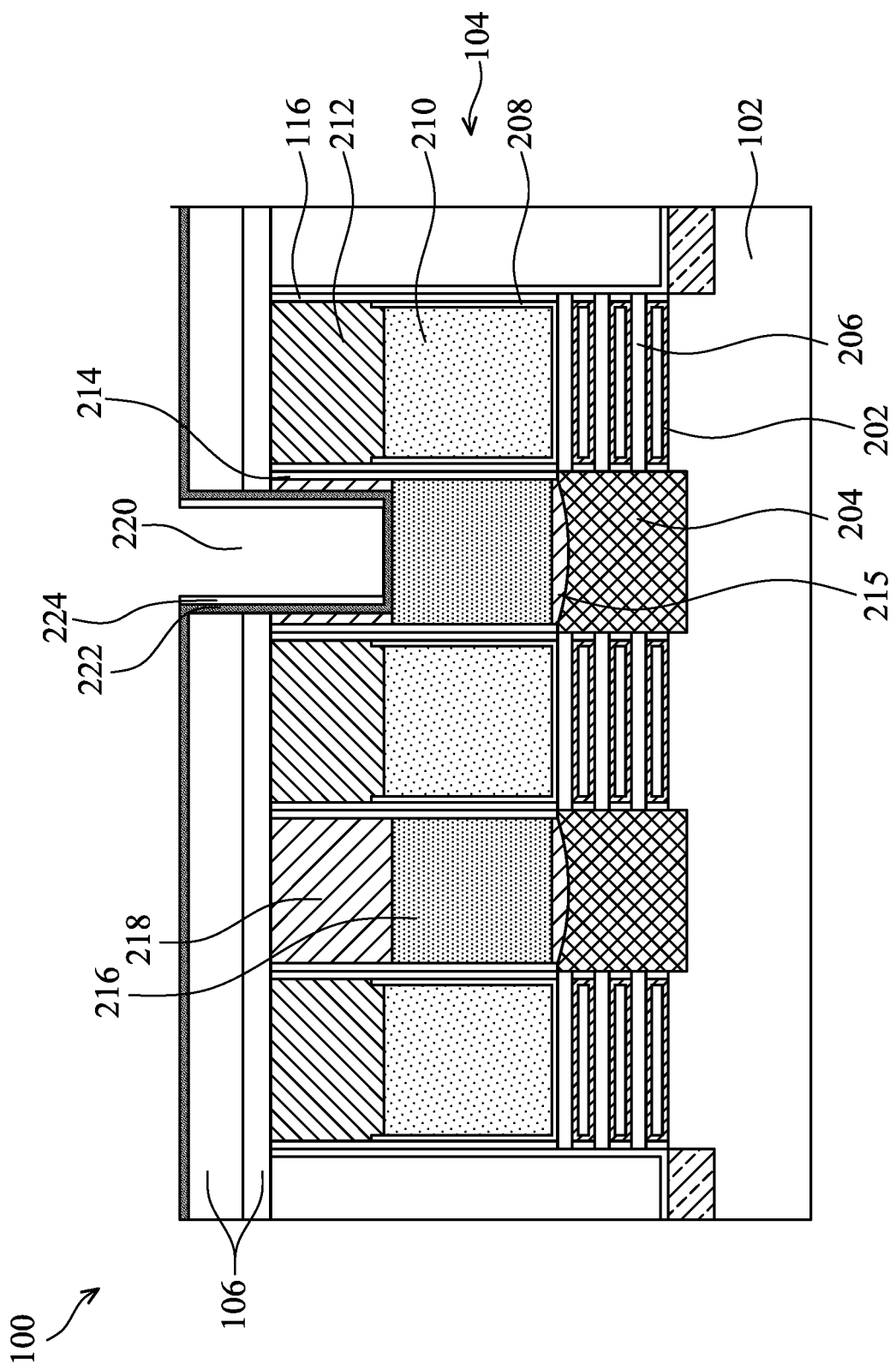

As shown in FIG. 2d, a first spacer layer 222 is conformally deposited over the etch stop layer 106, the second dielectric cap layer 218 and the exposed S/D contact 216. In some embodiments, the first spacer layer 222 is in contact with the etch stop layer 106, the second dielectric cap layer 218, and the S/D contact 216. In some embodiments, the first spacer layer 222 may include, but are not limited to, SiN, ZrSi, SiCN, ZrAlO, TiO, TaO, ZrO, LaO, ZrN, SiC, ZnO, SiOC, HfO, LaO, AlO, SiOCN, AlON, YO, TaCN, SiO, or any combinations thereof. The thickness of the first spacer layer 222 at the bottom of the opening 220 may be about 0.5 nm to about 20 nm, and the thickness of the first spacer layer 222 at the sidewall of the opening 220 may be about 0.5 nm to about 20 nm. The first spacer layer 222 protects the S/D contact 216 during subsequent removal of portions of a dummy spacer layer 224 (FIG. 2e). Thus, if the thickness of the first spacer layer 222 is less than about 0.5 nm, the first spacer layer 222 may not be sufficient to protect the S/D contact 216. On the other hand, if the thickness of the first spacer layer 222 is greater than about 20 nm, the dimensions of an air gap 232 (FIGS. 2j-2l) formed subsequently on the first spacer layer 222 may be too small to provide improved isolation between neighboring conductive structures. The first spacer layer 222 may be formed by any suitable method, such as ALD, CVD or PECVD.

Next, a dummy spacer layer 224 is conformally deposited on the first spacer layer 222. In some embodiments, the dummy spacer layer 224 may include a material having different etch selectivity than the material of the first spacer layer 222. For example, the dummy spacer layer 224 may include a semiconductor material, such as Si, Ge, SiGeB, or other suitable semiconductor material, which has a different etch selectivity than the dielectric material of the first spacer layer 222. In some embodiments, the dummy spacer layer 224 may be conformally deposited and may have a thickness ranging from about 0.5 nm to 20 nm. The thickness of the dummy spacer layer 224 defines a width of the air gap 232 (FIGS. 2j-2l). Thus, if the width of the air gap 232 is less than about 0.5 nm, the air gap 232 may not provide improved electrical isolation between neighboring conductive structures. On the other hand, if the width of the air gap 232 is greater than about 20 nm, any materials, such as a seal layer 234 (FIGS. 2k and 2l), formed over the air gap 232 may fill the entire air gap 232. The dummy spacer layer 224 may be formed by any suitable method, such as ALD, CVD or PECVD.

As shown in FIG. 2e, a breakthrough operation is performed to remove portions of the dummy spacer layer 224. In the breakthrough operation, the horizontal portions of the dummy spacer layer 224 disposed over the first spacer layer 222 are removed, and the vertical portions of the dummy spacer layer 224 are kept on first spacer layer 222 formed on the sidewalls of the opening 220. The remained vertical portions of the dummy spacer layer 224 defines the air gap 232 formed subsequently. The removal of portions of the dummy spacer layer 224 may be performed by any suitable method, such as an etching process. In one example, the etching process is an anisotropic dry etch process that utilizes chlorine or fluorine based etchant. The anisotropic dry etch removes the portions of the dummy spacer layer 224 disposed on horizontal surfaces but does not remove the portions disposed adjacent the sidewall of the opening 220. The chlorine or fluorine based etchant selectively removes the portions of the dummy spacer layer 224, while the first spacer layer 222 is not removed. The first spacer layer 222 protects the S/D contact 216 during the removal of the portions of the dummy spacer layer 224.

Figure 2F:
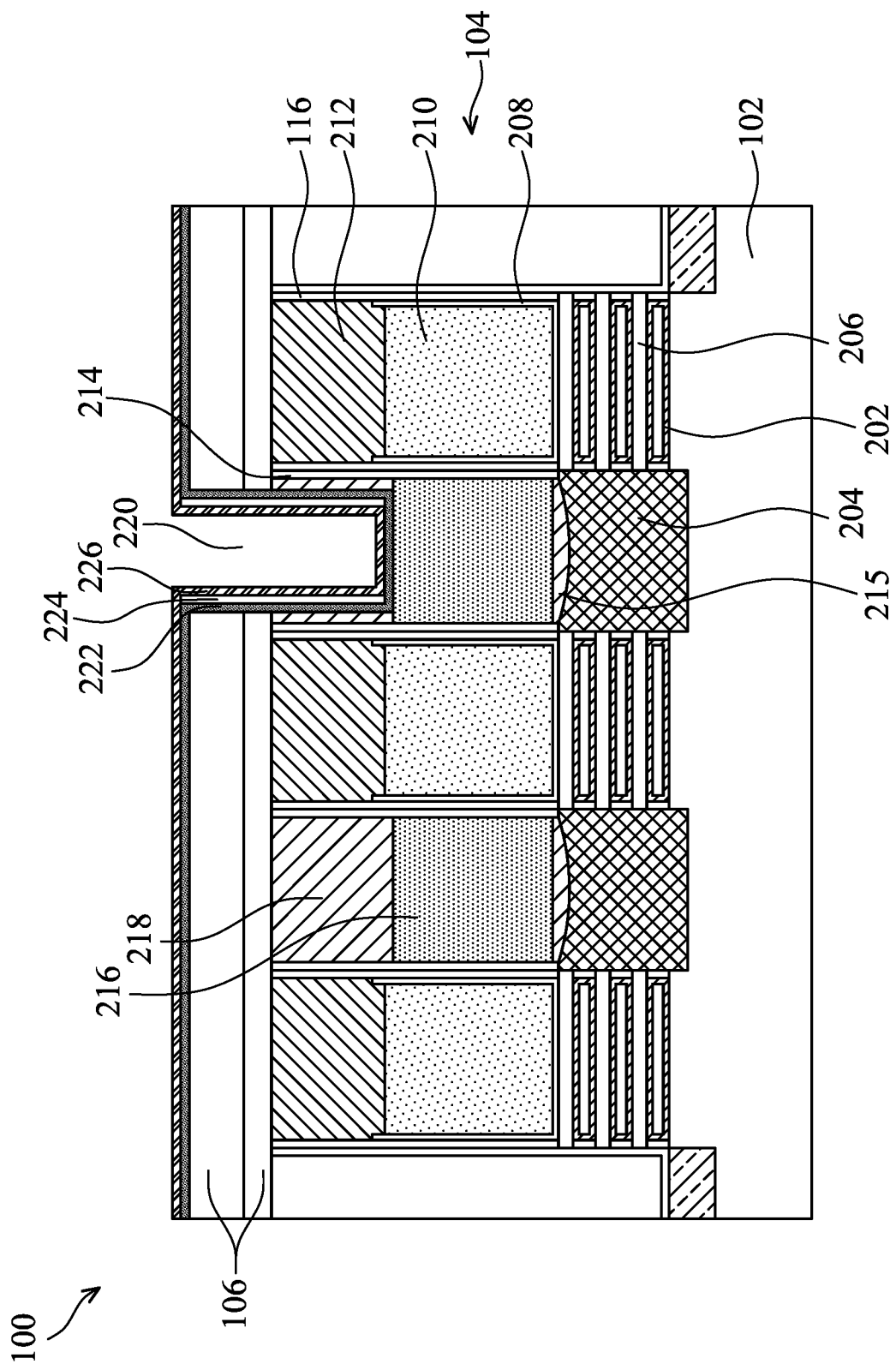

As shown in FIG. 2f, a second spacer layer 226 is deposited over the first spacer layer 222 and the dummy spacer layer 224. In some embodiments, the second spacer layer 226 is in contact with the portions of the first spacer layer 222 disposed on the etch stop layer 106 and on the S/D contact 216. The second spacer layer 226 may be in contact with the dummy spacer layer 224. In some embodiments, the second spacer layer 226 may include, but are not limited to, SiN, ZrSi, SiCN, ZrAlO, TiO, TaO, ZrO, LaO, ZrN, SiC, ZnO, SiOC, HfO, LaO, AlO, SiOCN, AlON, YO, TaCN, SiO, or any combinations thereof. The second spacer layer 226 may include the same or different material as the first spacer layer 222. The second spacer layer 226 may be formed from a material having a different etch selectivity as the dummy spacer layer 224. In some embodiments, the second spacer layer 226 may be conformally deposited and may have a thickness ranging from about 0.5 nm to about 20 nm. The second spacer layer 226 provides structural support to S/D conductive layer 230 (FIGS. 2i-2l) formed subsequently. Thus, if the thickness of the second spacer layer 226 is less than about 0.5 nm, the second spacer layer 226 may not be sufficient to support the S/D conductive layer 230. On the other hand, if the thickness of the second spacer layer 226 is greater than about 20 nm, the manufacturing cost is increased without significant advantage. The second spacer layer 226 may be formed by any suitable method, such as ALD, CVD or PECVD. After the deposition of the second spacer layer 226, the vertical portions of the second spacer layer 226 cover the exposed first spacer layer 222, and the vertical portions of the second spacer layer 226 cover the dummy spacer layer 224. The vertical portions of the second spacer layer 226 and the vertical portions of the first spacer layer 222 are separated by the dummy spacer layer 224.

Figure 2G:
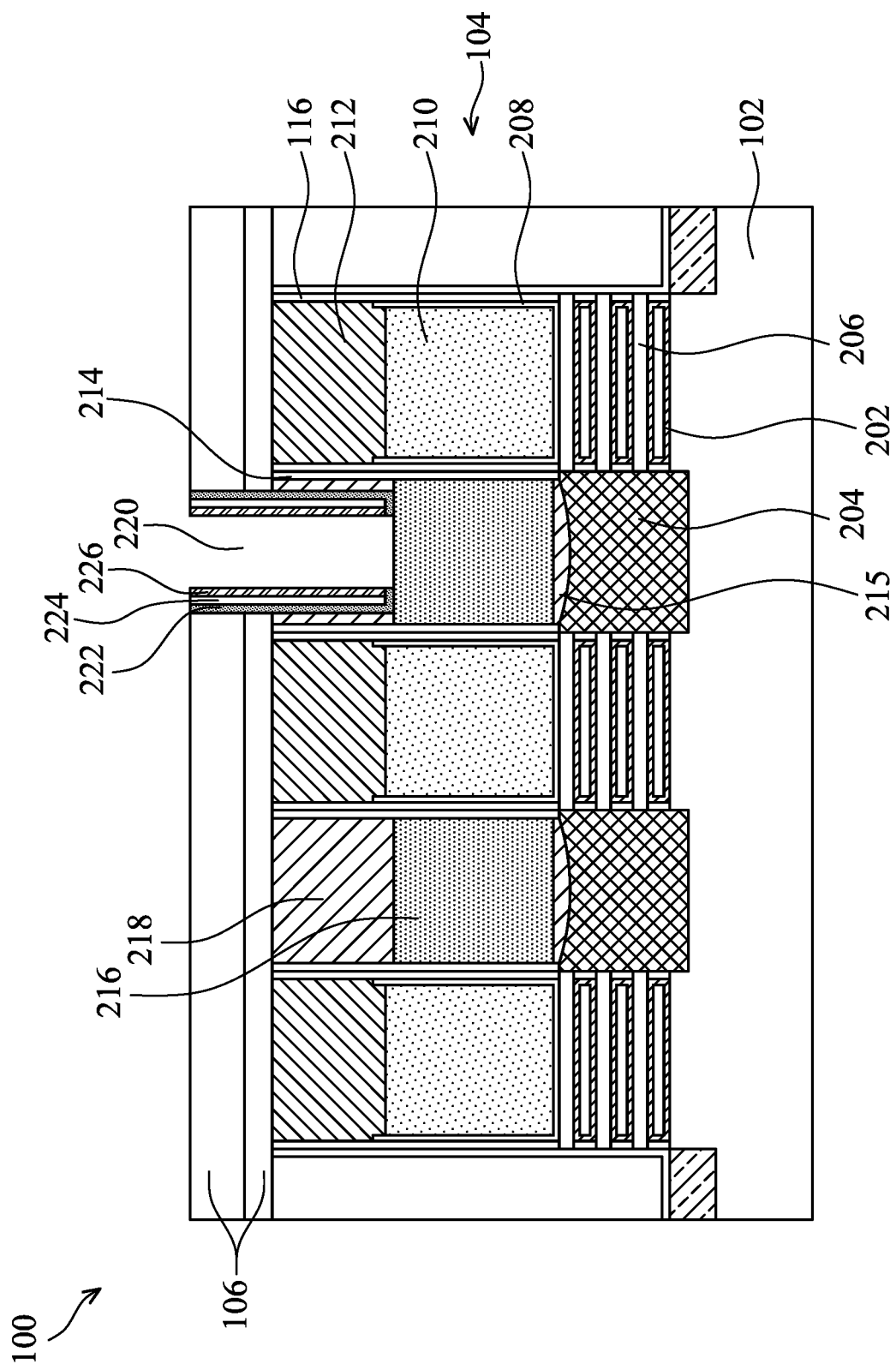

As shown in FIG. 2g, portions of the first spacer layer 222 and the second spacer layer 226 are removed to expose the etch stop layer 106 and the S/D contact 216. In some embodiments, the portions of the second spacer layer 226 disposed over the horizontal surfaces of the first spacer layer 222 and over the dummy spacer layer 224 are removed, leaving the portions of the second spacer layer 226 adjacent the dummy spacer layer 224. Portions of the first spacer layer 222 that are disposed on the horizontal surfaces of the etch stop layer 106 and on the S/D contact 216 not covered by the dummy spacer layer 224 and the second spacer layer 226 are also removed. After the removal operation, one end of the second spacer layer 226 is in contact with the horizontal portion of the first spacer layer 222, and the second spacer layer 226 and the vertical portion of the first spacer layer 222 are separated by the dummy spacer layer 224.

The removal of the portions of the first spacer layer 222 and the second spacer layer 226 may be performed by any suitable method, such as an etching process. In one example, the etching process is an anisotropic dry etch process. The anisotropic dry etch process removes the portions of the first spacer layer 222 and the second spacer layer 226 disposed on horizontal surfaces but does not remove the portions disposed adjacent the sidewalls of the opening 220. The anisotropic dry etch process may be a selective process that removes the portions of the first spacer layer 222 and second spacer layer 226, while the S/D contact 216 and the etch stop layer 106 are not removed. As a result, each second spacer layer 226 is adjacent and in contact with the dummy spacer layer 224, which is adjacent and in contact with the first spacer layer 222 that is adjacent and in contact with the vertical surface of the etch stop layer 106 and the second dielectric cap layer 218. Furthermore, the second spacer layer 226 and the dummy spacer layer 224 are disposed on and in contact with the portion of the first spacer layer 222, which is disposed on and in contact with the top surface of the S/D contact 216, as shown in FIG. 2g.

Figure 2H:
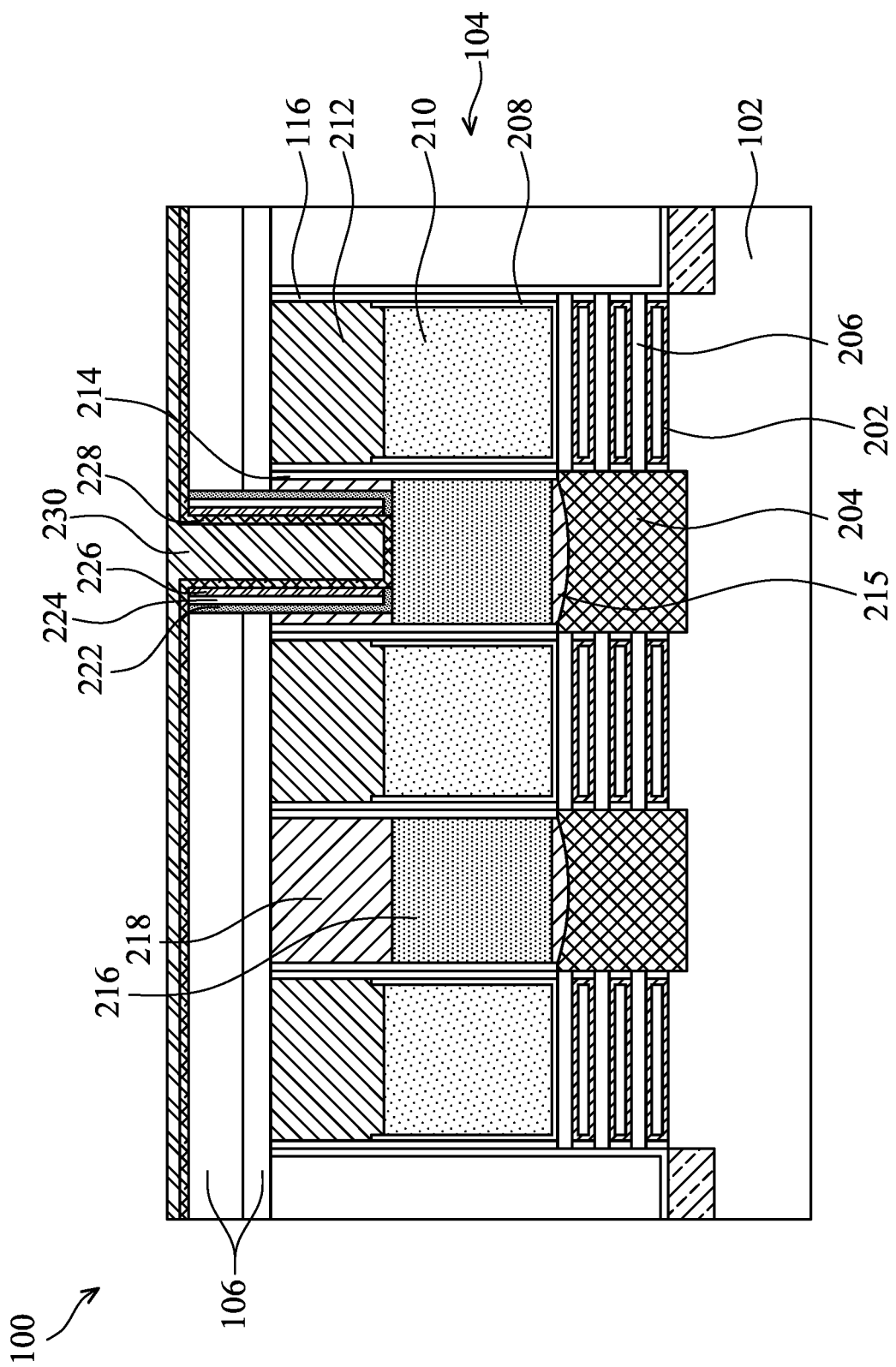

As shown in FIG. 2h, a glue layer 228 is formed over the etch stop layer 106, the first spacer layers 222, the dummy spacer layer 224, the second spacer layer 226 and the S/D contact 216, and the glue layer 228 covers the sidewalls of the opening 220. An S/D conductive layer 230 is deposited over the glue layer 228. The glue layer 228 may include, but are not limited to, W, Ru, Co, Cu, Mo, TaN, TiN, or any combinations thereof. The glue layer 228 may be a single layer or a multilayer structure, such as a two-layer structure or a three-layer structure. In some embodiments, the glue layer 228 may be conformally deposited and may have a thickness ranging from about 1 nm to about 50 nm. The glue layer 228 may be formed by any suitable method, such as ALD, CVD or PECVD. The S/D conductive layer 230 is formed on the glue layer 228, as shown in FIG. 2h. The S/D conductive layer 230 may include, but are not limited to, W, Ru, Co, Cu, Mo, TaN, TiN, or any combinations thereof. The S/D conductive layer 230 may include the same or different material as the glue layer 228. In some embodiments, the glue layer 228 is not present, and the S/D conductive layer 230 is formed on the etch stop layer 106, the first spacer layers 222, the dummy spacer layer 224, the second spacer layer 226 and the S/D contact 216.

Figure 2I:
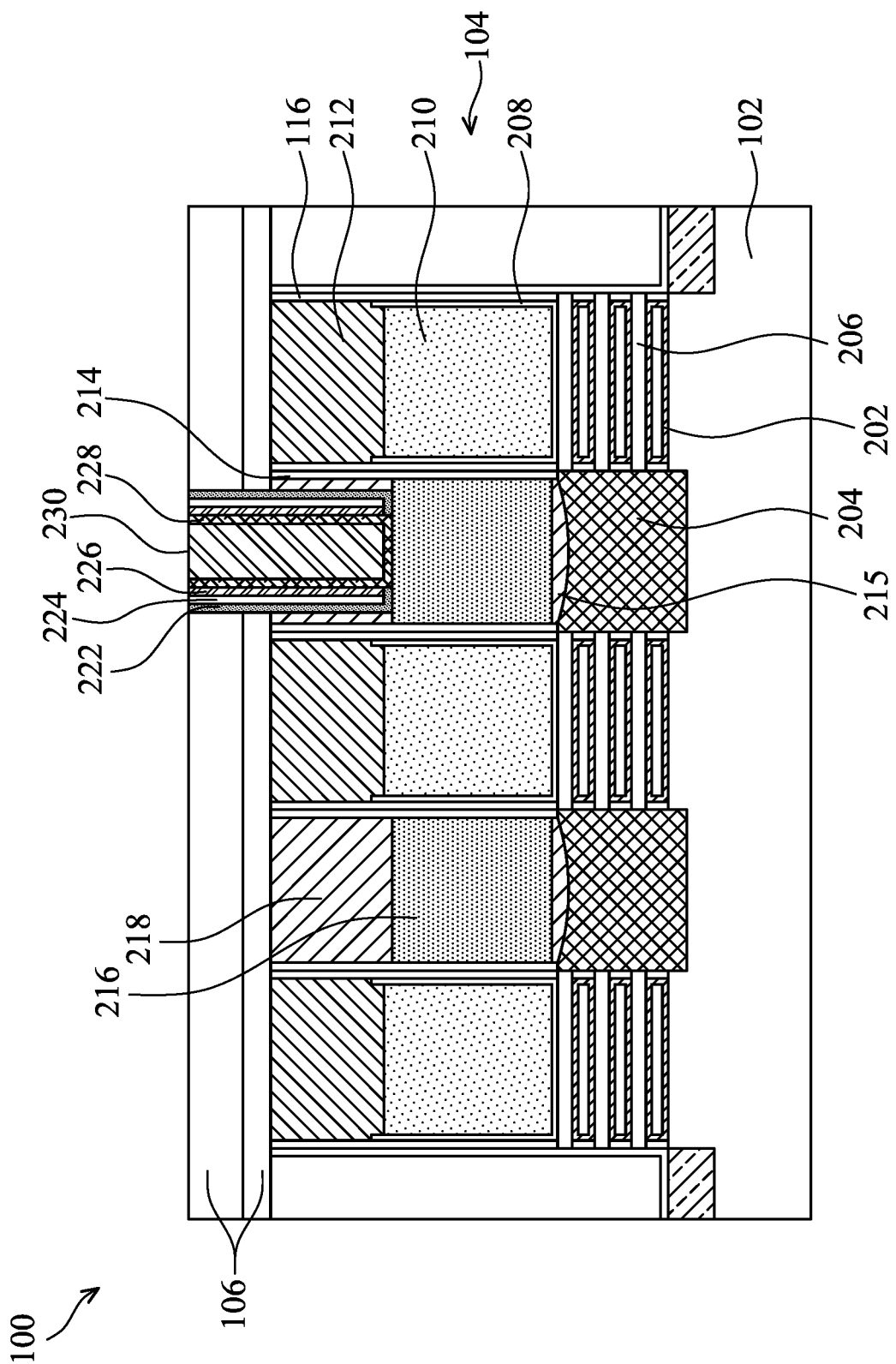
Figure 2J:
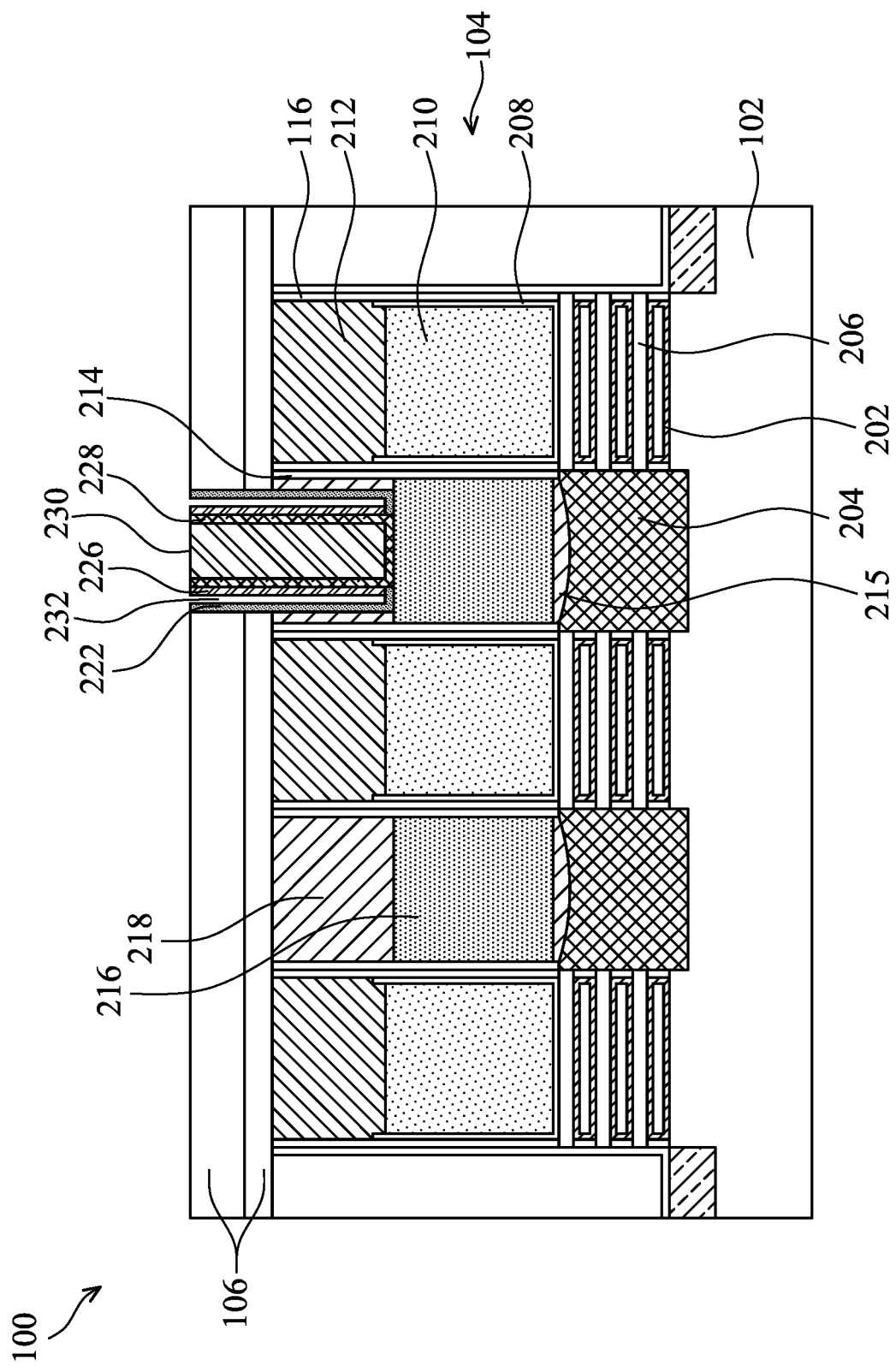
Figure 2K:
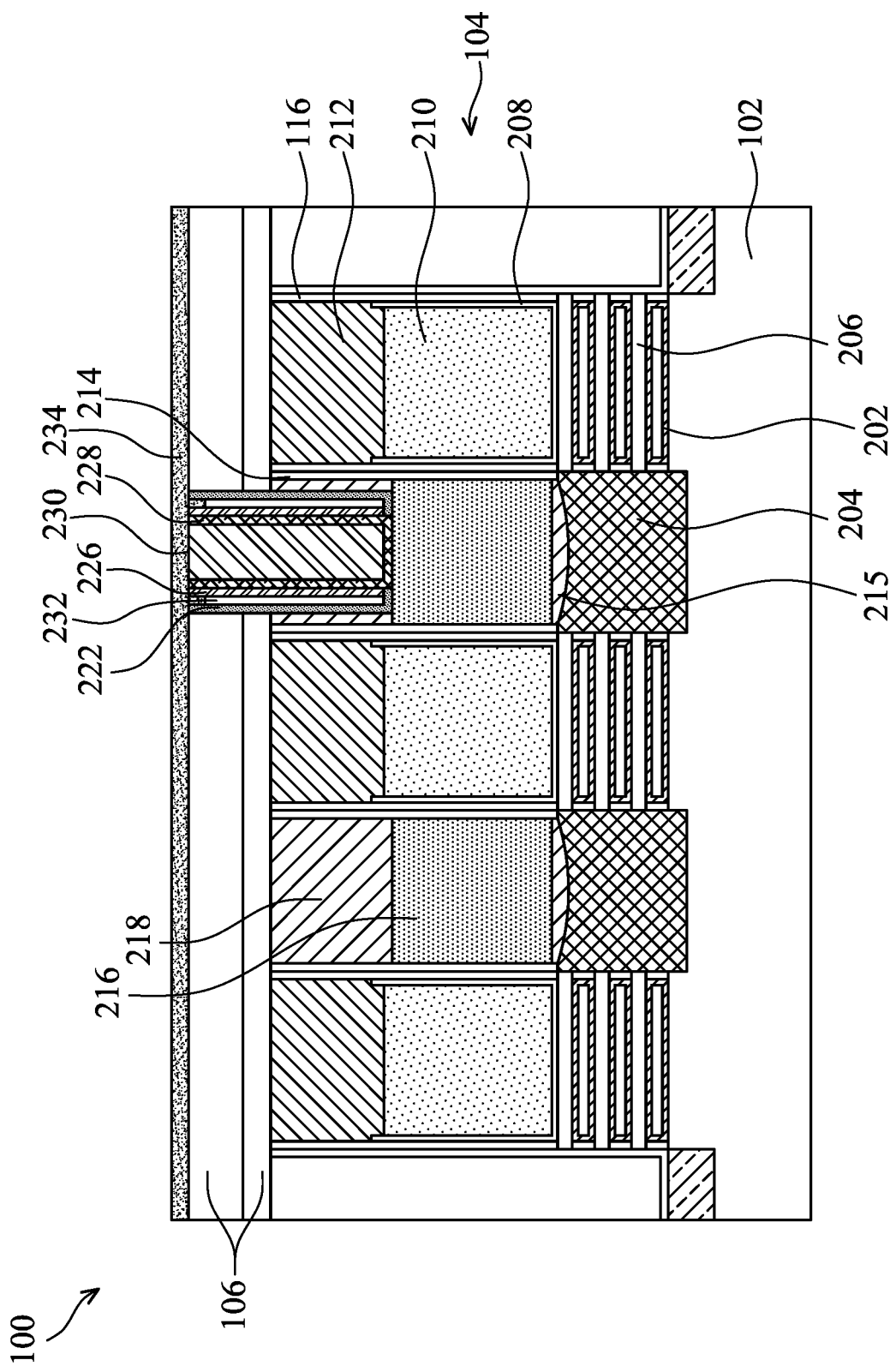
Figure 21:
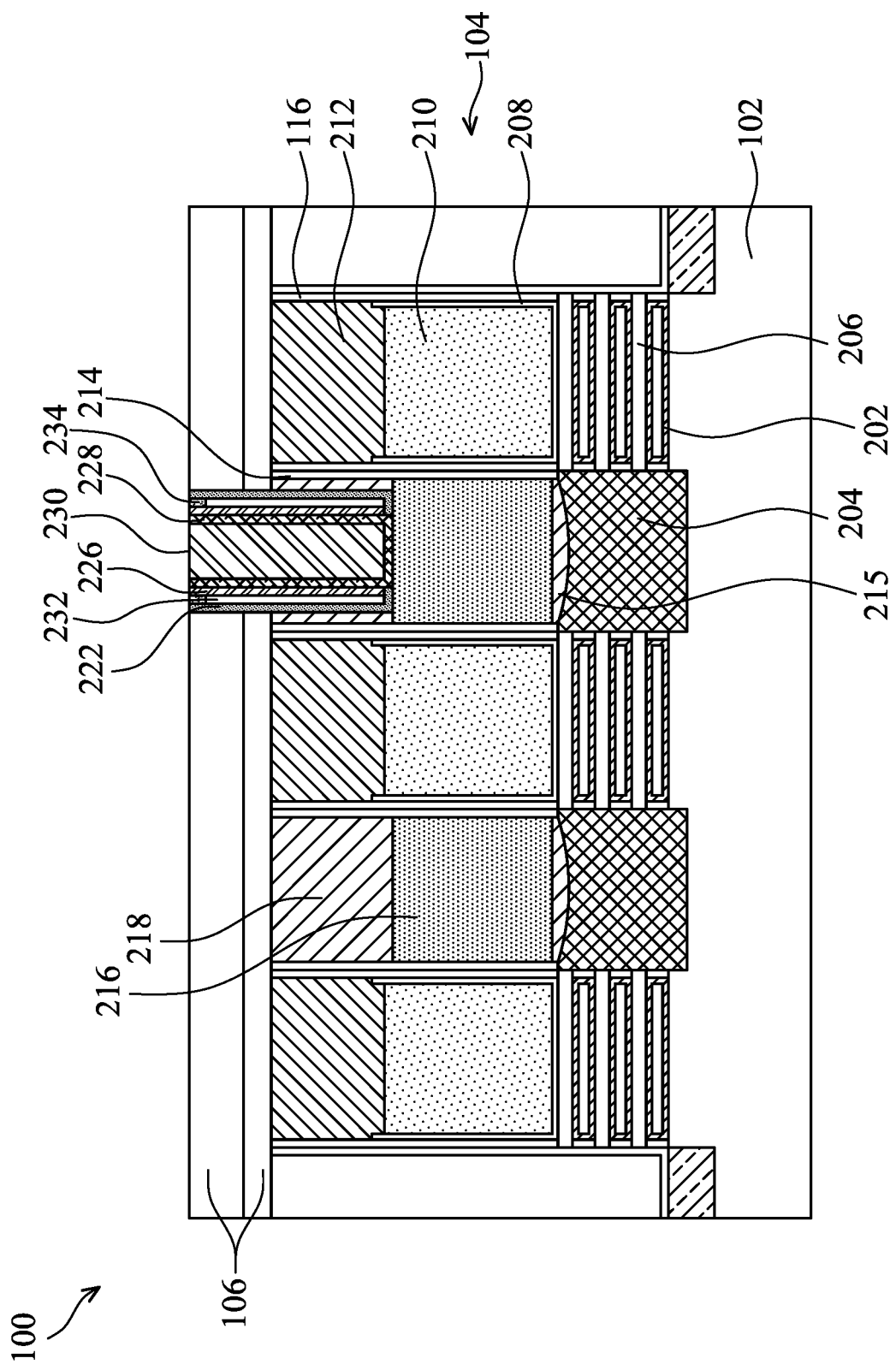

Next, as shown in FIG. 2i, a planarization process is performed to expose the etch stop layer 106, the first spacer layers 222, the dummy spacer layers 224, the second spacer layers 226, the glue layer 228 and the S/D conductive layer 230. The planarization process may be any suitable process, such as a chemical mechanical polishing (CMP) process. The planarization process removes portions of the glue layer 228 and the S/D conductive layer 230 so the S/D conductive layer 230 is substantially coplanar with the etch stop layer 106. In some embodiments, after the planarization process, the S/D conductive layer 230 may have a height from about 1 nm to about 50 nm and a width from about 1 nm to about 20 nm.

As shown in FIG. 2j, a dummy spacer removal operation is performed to remove the dummy spacer layer 224. The dummy spacer layer 224 disposed between the first spacer layer 222 and the second spacer layer 226 is removed to form the air gaps 232. The removal of the dummy spacer layer 224 may be performed by any suitable method, such as an etching process. In some embodiments, the etching process is selective dry etch process that utilizes chlorine or fluorine based etchant. The chlorine or fluorine based etchant selectively removes the dummy spacer layer 224, while the etch stop layer 106, the first spacer layers 222, the second spacer layer 226, the glue layer 228 and the S/D conductive layer 230 are not removed. The second spacer layer 226 may function as a structure support for the S/D conductive layer 230. Without the second spacer layer 226, the S/D conductive layer 230 may collapse into the air gap 232.

The air gap 232 may have a width defined by the thickness of the dummy spacer layer 224. In some embodiments, the air gap 232 has a width ranging from about 0.5 nm to about 20 nm. As shown in FIG. 2j, the first spacer layer 222 includes a vertical portion disposed on the vertical surface of the etch stop layer 106 and the second dielectric cap layer 218. The first spacer layer 222 includes a horizontal portion disposed on the S/D contact 216. The second spacer layer 226 is disposed on and in contact with the horizontal portion of the first spacer layer 222. The air gap 232 is formed between the second spacer layer 226 and the vertical portion of the first spacer layer 222.

As shown in FIG. 2k, a seal layer 234 is deposited over the etch stop layer 106, the first spacer layers 222, the second spacer layer 226, the glue layer 228 and the S/D conductive layer 230. Portions of the seal layer 234 partially fill the air gap 232. The seal layer 234 is disposed over the air gap 232 and between portions of the first spacer layer 222 and the second spacer layer 226. The seal layer 234 does not completely fill the air gap 232 due to the small opening (i.e., the width of the air gap 232) of the air gap 232. The seal layer 234 may include the same or different material as the first spacer layer 222. In some embodiments, the seal layer 234 may include, but are not limited to, SiN, ZrSi, SiCN, ZrAlO, TiO, TaO, ZrO, LaO, ZrN, SiC, ZnO, SiOC, HfO, LaO, AlO, SiOCN, AlON, YO, TaCN, SiO, or any combinations thereof. The seal layer 234 may be formed by any suitable method, such as CVD. The seal depth of the seal layer 234 depends on the thickness of the air gap 232. In some embodiments, the seal depth of the seal layer 234 that partially fills the air gap 232 may be from about 1 nm to about 20 nm. The seal layer 234 seals the air gap 232 to prevent the air gap 232 from being filled by any material formed over the air gap 232. Thus, if the seal depth is less than about 1 nm, the seal layer 234 may not be sufficient to seal the air gap 232. On the other hand, if the seal depth is greater than about 20 nm, the dimensions of the air gap 232 may be too small to provide improved electrical isolation between neighboring conductive structures.

In FIG. 2l, a planarization process is performed to remove portions of the seal layer 234 to expose the etch stop layer 106, the first spacer layers 222, the second spacer layer 226, the glue layer 228 and the S/D conductive layer 230. As shown in FIG. 2l, after the planarization process, portions of the seal layer 234 partially filling in the air gap 232 remain in the air gap 232. The planarization process may be any suitable process, such as a chemical mechanical polishing (CMP) process.

Figure 3:
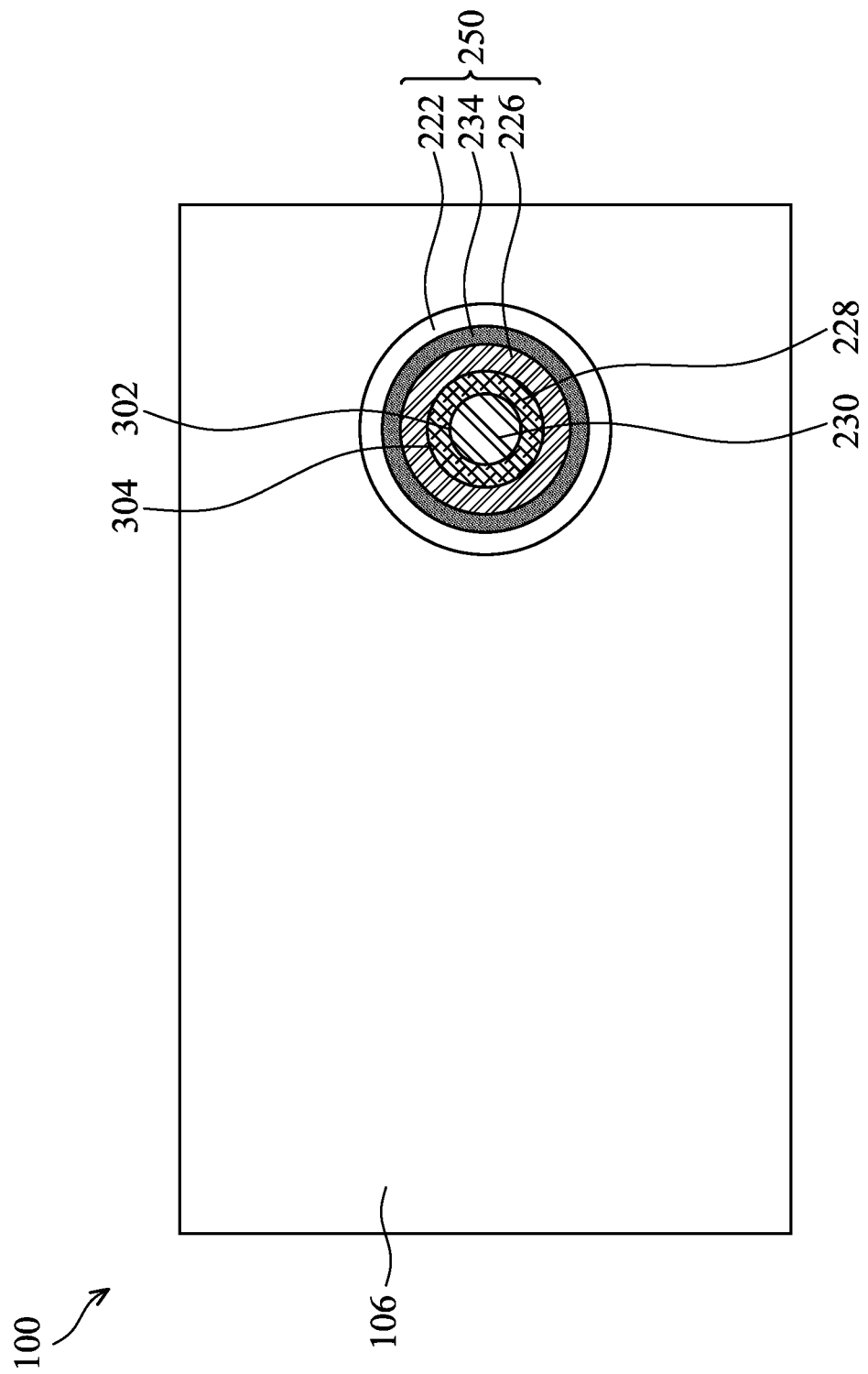
FIG. 3 is a top view of a stage of manufacturing a semiconductor device structure, in accordance with some embodiments.
Figure 4:
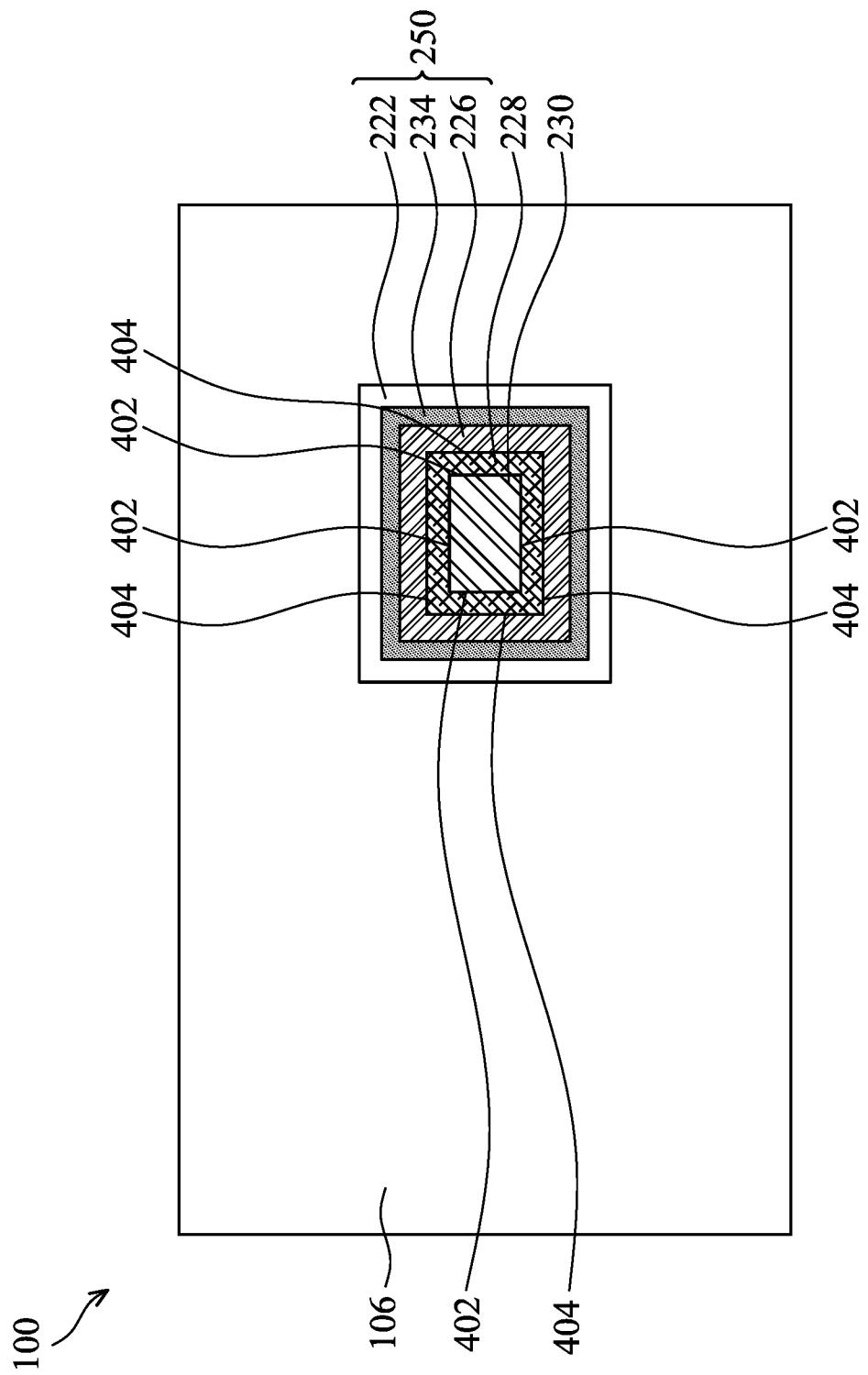
FIG. 4 is a top view of a stage of manufacturing the semiconductor device structure, in accordance with some embodiments.

FIG. 3 shows a top view of the semiconductor device structure 100 in FIG. 2l after the planarization process. The S/D conductive layer 230 is formed in the etch stop layer 106 and is surrounded by the glue layer 228, the second spacer layer 226, the air gap 232 (FIG. 2l), the seal layer 234 and the first spacer layers 222. In some embodiments, the shape of the top view of the first spacer layers 222, the seal layer 234, the second spacer layer 226, the air gap 232, the glue layer 228 and the S/D conductive layer 230 may be circular. The sidewall 302 of the S/D conductive layer 230 may be a continuous surface, and the sidewall 304 of the glue layer 228 may be a continuous surface as well, as shown in FIG. 3. In some embodiments, the shape of the top view of the first spacer layers 222, the seal layer 234, the second spacer layer 226, the air gap 232, the glue layer 228 and the S/D conductive layer 230 may be squares, rectangles or other shapes. The sidewall 402 of the S/D conductive layer 230 may include multiple surfaces, and the sidewall 404 of the glue layer 228 may include multiple surfaces as well, as shown in FIG. 4. The air gap 232 formed below the seal layer 234 may reduce any coupling capacitances and provide improved electrical isolation.

As shown in FIGS. 3 and 4, a spacer structure 250 is formed in the etch stop layer 106 surrounding the glue layer 228 and the S/D conductive layer 230. The spacer structure 250 includes the first spacer layers 222, the second spacer layer 226, the air gap 232 (FIG. 2l) formed between the first spacer layers 222 and the second spacer layer 226, and the seal layer 234. The seal layer 234 is formed above the air gap 232 to seal the air gap 232.

Figure 5:
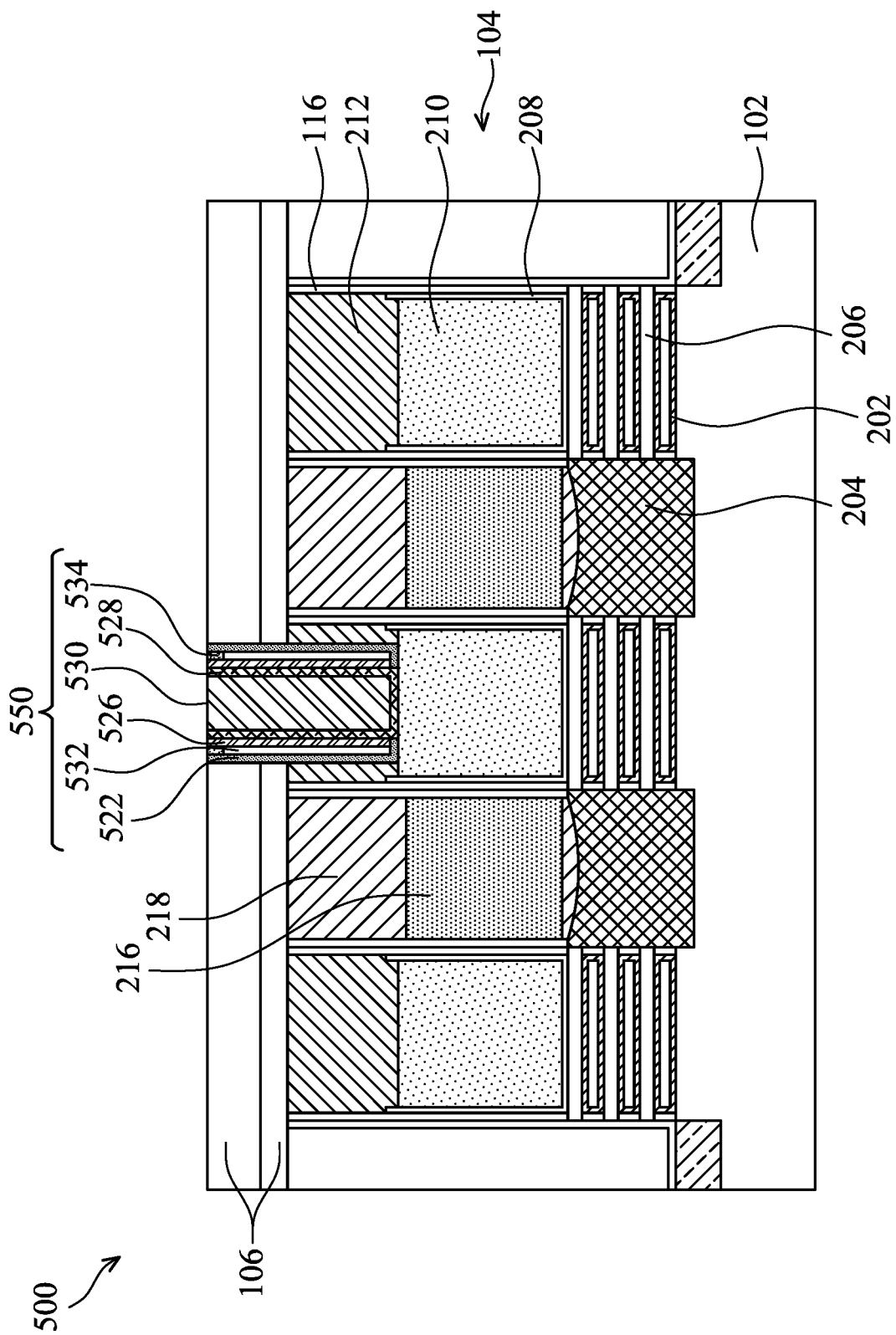
FIG. 5 is a cross-sectional side view of a stage of manufacturing the semiconductor device structure, in accordance with some embodiments.

FIG. 5 is a cross-sectional side view of a stage of manufacturing the semiconductor device structure 500, in accordance with some embodiments. As shown in FIG. 5, the semiconductor device structure 500 includes the substrate 102, the one or more devices 104, and the etch stop layer 106. The one or more devices includes the gate electrode layer 210 and the first dielectric cap layer 212 disposed on the gate electrode layer 210. A spacer structure 550 may be disposed in the first dielectric cap layer 212 and the etch stop layer 106. The spacer structure 550 may include a first spacer layer 522, a second spacer layer 526, an air gap 532, and a seal layer 534. The first spacer layer 522 may include a first portion in contact with the gate electrode layer 210 and a second portion in contact with the first dielectric cap layer 212 and the etch stop layer 106. The second spacer layer 526 may be disposed on the first portion of the first spacer layer 522. The air gap 532 may be formed between the first portion of the first spacer layer 522 and the second spacer layer 526. The seal layer 534 may be disposed over the air gap 532 and between the first portion of the first spacer layer 522 and the second spacer layer 526. The first spacer layer 522, the second spacer layer 526, the air gap 532, and the seal layer 534 may be formed by the same methods as the first spacer layer 222, the second spacer layer 226, the air gap 232, and the seal layer 234, respectively. The first spacer layer 522, the second spacer layer 526, and the seal layer 534 may include the same material as the first spacer layer 222, the second spacer layer 226, and the seal layer 234, respectively.

A glue layer 528 and a gate conductive layer 530 may be disposed in the first dielectric cap layer 212 and the etch stop layer 106, as shown in FIG. 5. The glue layer 528 and the gate conductive layer 530 may include the same material and formed by the same method as the glue layer 228 and the S/D conductive layer 230, respectively. Similar to the glue layer 228, the glue layer 528 may be optional in some embodiments. In some embodiments, the glue layer 528 is in contact with the gate electrode layer 210 and the second spacer layer 526, and the gate conductive layer 530 is in contact with the glue layer 528. The glue layer 528 and the gate conductive layer 530 may be surrounded by the spacer structure 550, as shown in FIG. 5.

Similar to the semiconductor device structure 100 shown in FIGS. 3 and 4, the shape of a top view of the first spacer layers 522, the seal layer 534, the second spacer layer 526, the glue layer 528 and the gate conductive layer 530 may be circular shape, squares, rectangles or other shapes. The shape of the air gap 532 may be similar to the shape of the air gap 232.

Figure 6:
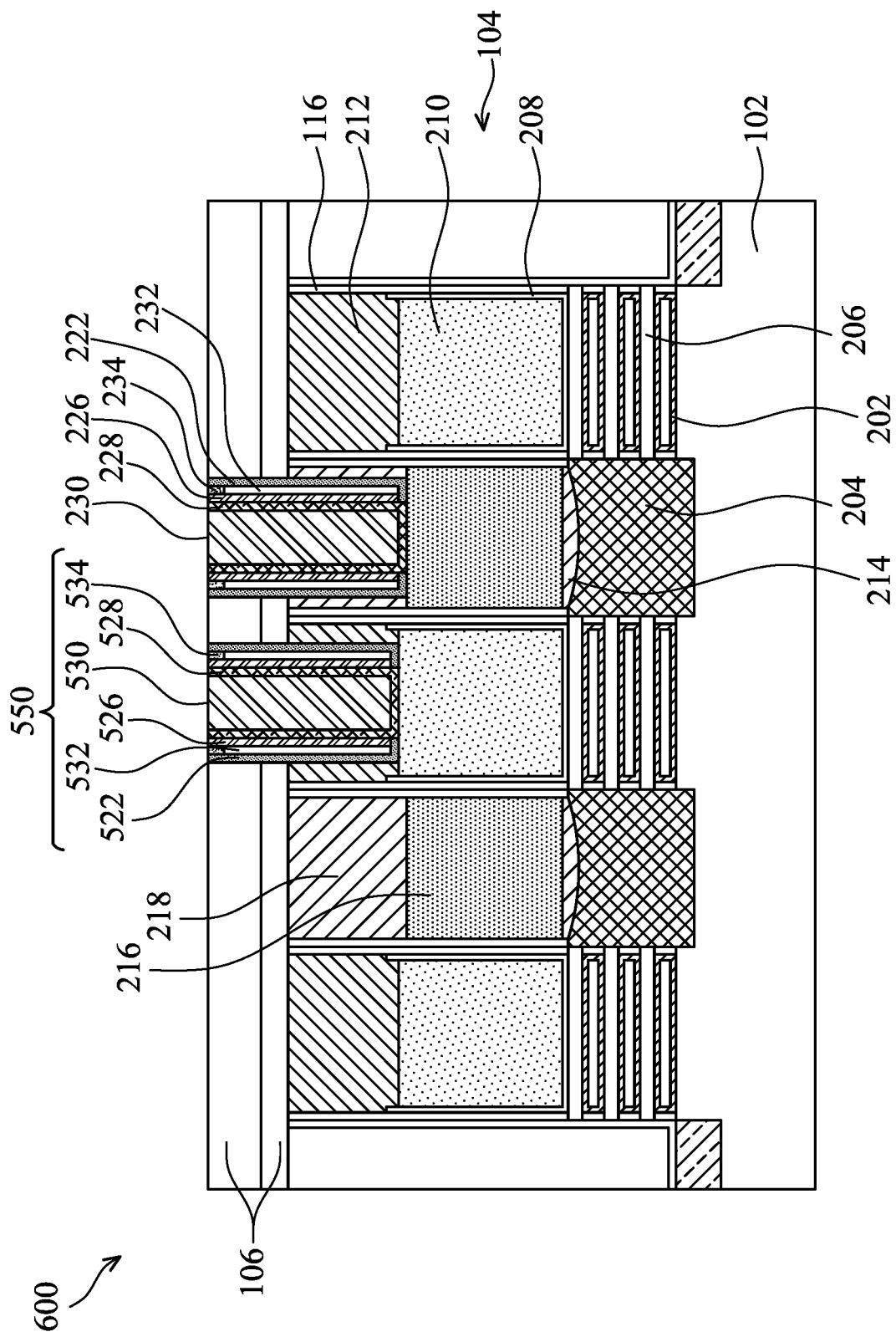
FIG. 6 is a cross-sectional side view of a stage of manufacturing the semiconductor device structure, in accordance with some embodiments.

FIG. 6 is a cross-sectional side view of a stage of manufacturing the semiconductor device structure 600, in accordance with some embodiments. As shown in FIG. 6, the semiconductor device structure 600 includes the gate conductive layer 530 and the S/D conductive layer 230. In some embodiments, the gate conductive layer 530 and the spacer structure 550 around the gate conductive layer 530 may be formed first and the S/D conductive layer 230 and the spacer structure 250 (FIG. 3) around the S/D conductive layer 230 may be formed later. In some embodiments, the S/D conductive layer 230 and the spacer structure 250 around the S/D conductive layer 230 may be formed first and the gate conductive layer 530 and the spacer structure 550 around the gate conductive layer 530 may be formed later. In some embodiments, the S/D conductive layer 230, the spacer structure 250 around the S/D conductive layer 230, the gate conductive layer 530 and the spacer structure 550 around the gate conductive layer 530 may be formed together with the same process flow.

The present application discloses the structures and the manufacturing process of a spacer structure having an air gap formed within. These spacer structure may be formed surrounding the sidewall of the S/D conductive layers and/or the gate conductive layers to prevent the coupling capacitance between the metal areas, such as between the S/D conductive layers 230 and the metal lines, between the gate conductive layers 330 and the metal lines, between the S/D conductive layers 230 and the gate electrode layer 210, or between the gate conductive layers 330 and the S/D contact 216. Furthermore, the spacer structures disclosed in the present application may provide a better isolation between the S/D conductive layers or the gate conductive layers and other metal areas.

In some embodiments, the semiconductor device structure includes a substrate, a source/drain contact disposed over the substrate, a first dielectric layer disposed on the source drain contact, an etch stop layer disposed on the first dielectric layer, and a source/drain conductive layer disposed in the etch stop layer and the first dielectric layer. The source/drain conductive layer is disposed over the source/drain contact. The structure further includes a spacer structure disposed in the etch stop layer and the first dielectric layer. The spacer structure surrounds a sidewall of the source/drain conductive layer and includes a first spacer layer having a first portion and a second spacer layer adjacent the first portion of the first spacer layer. The first portion of the first spacer layer and the second spacer layer are separated by an air gap. The structure further includes a seal layer disposed between the first portion of the first spacer layer and the second spacer layer.

In another embodiments, the semiconductor device structure includes a substrate, a gate stack formed over the substrate, a first dielectric layer formed on the gate stack, an etch stop layer formed on the first dielectric layer, and a gate conductive layer formed in the etch stop layer and the first dielectric layer. The gate conductive layer is disposed over the gate stack. The structure further includes a spacer structure disposed in the etch stop layer and the first dielectric layer. The spacer structure surrounds a sidewall of the gate conductive layer and includes a first spacer layer having a first portion and a second spacer layer adjacent the first portion of the first spacer layer. The first portion of the first spacer layer and the second spacer layer are separated by an air gap. The structure further includes a seal layer disposed between the first portion of the first spacer layer and the second spacer layer.

In a further embodiments, a method for fabricating the semiconductor device structure includes forming a source/drain contact over a substrate, forming a first dielectric layer over the source/drain contact, forming an etch stop layer over the first dielectric layer, forming an opening in the etch stop layer and the first dielectric layer to expose a portion of the source/drain contact, and forming a spacer structure in the opening. The spacer structure includes an air gap. The method further includes forming a source/drain conductive layer in the opening over the source/drain contact, and the spacer structure surrounds the source/drain conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
   a substrate;
   a source/drain contact disposed over the substrate;
   a first dielectric layer disposed on the source/drain contact;
   an etch stop layer disposed on the first dielectric layer;
   a source/drain conductive layer disposed in the etch stop layer and the first dielectric layer, wherein the source/drain conductive layer is disposed over the source/drain contact; and
   a first spacer structure disposed in the etch stop layer and the first dielectric layer, wherein the first spacer structure surrounds a sidewall of the source/drain conductive layer, wherein the first spacer structure comprises:
   a first spacer layer comprising a first portion and a second portion, wherein the first portion of the first spacer layer extends along a sidewall of the etch stop layer and the first dielectric layer, and the second portion of the first spacer layer is in contact with the source/drain contact;
a second spacer layer adjacent the first portion of the first spacer layer and separated from the first portion of the first spacer layer by a first air gap, wherein the second spacer layer is in contact with the second portion of the first spacer layer; and
a first seal layer disposed between the first portion of the first spacer layer and the second spacer layer.

2. The semiconductor device structure of claim 1, wherein the first air gap is defined by the first portion of the first spacer layer, the second portion of the first spacer layer, the second spacer layer, and the first seal layer.

3. The semiconductor device structure of claim 1, further comprising a glue layer disposed between the source/drain conductive layer and the second spacer layer and between the source/drain conductive layer and the source/drain contact.

4. The semiconductor device structure of claim 3, wherein the etch stop layer, the first spacer layer, the first seal layer, the second spacer layer, the glue layer and the source/drain conductive layer have a substantial coplanar surface.

5. The semiconductor device structure of claim 1, wherein a width of the first air gap is from about 0.5 nm to about 20 nm.

6. The semiconductor device structure of claim 1, further comprising a gate stack disposed over the substrate.

7. The semiconductor device structure of claim 6, further comprising a second spacer structure disposed over the gate stack, wherein the second spacer structure comprises:
a third spacer layer;
a fourth spacer layer adjacent a portion of the third spacer layer and separated from the portion of the third spacer layer by a second air gap; and
a second seal layer disposed between the portion of the third spacer layer and the fourth spacer layer.

8. The semiconductor device structure of claim 7, further comprising a gate conductive layer disposed over the gate stack, wherein the second spacer structure surrounds a sidewall of the gate conductive layer.

9. A semiconductor device structure, comprising:
a substrate;
a gate stack disposed over the substrate;
a first dielectric layer disposed on the gate stack;
an etch stop layer disposed on the first dielectric layer;
a gate conductive layer disposed in the etch stop layer and the first dielectric layer, wherein the gate conductive layer is disposed over the gate stack; and
a first spacer structure disposed in the etch stop layer and the first dielectric layer, wherein the first spacer structure surrounds a sidewall of the gate conductive layer, wherein the first spacer structure comprises:
a first spacer layer comprising a first portion and a second portion, wherein the first portion of the first spacer layer extends along a sidewall of the first dielectric layer and the etch stop layer, and the second portion of the first spacer layer is in contact with the gate stack;
a second spacer layer adjacent the first portion of the first spacer layer and separated from the first portion of the first spacer layer by a first air gap, wherein the second spacer layer is in contact with the second portion of the first spacer layer, and the first air gap is between the first portion of the first spacer layer and the second spacer layer; and
a first seal layer disposed between the first portion of the first spacer layer and the second spacer layer.

10. The semiconductor device structure of claim 9, further comprising:
a plurality of channel regions, wherein the gate stack surrounds each of the plurality of channel regions.

11. The semiconductor device structure of claim 10, wherein the gate stack comprises:
a gate electrode layer; and
one or more gate dielectric layers surrounding the gate electrode layer.

12. The semiconductor device structure of claim 9, wherein a cross section of a sidewall of the gate conductive layer is circular.

13. The semiconductor device structure of claim 12, wherein the first air gap surrounds the sidewall of the gate conductive layer.

14. The semiconductor device structure of claim 9, wherein the first portion of the first spacer layer, the second spacer layer and the first air gap are disposed along a same direction.

15. The semiconductor device structure of claim 9, further comprising a source/drain contact disposed over the substrate and a source/drain conductive layer disposed over the source/drain contact.

16. The semiconductor device structure of claim 15, further comprising a second spacer structure surrounding a sidewall of the source/drain conductive layer, wherein the second spacer structure comprises:
a third spacer layer;
a fourth spacer layer adjacent a portion of the third spacer layer and separated from the portion of the third spacer layer by a second air gap; and
a second seal layer disposed between the portion of the third spacer layer and the fourth spacer layer.

17. A method for fabricating a semiconductor device structure, comprising:
forming a source/drain contact over a substrate;
forming a first dielectric layer over the source/drain contact;
forming an etch stop layer over the first dielectric layer;
forming an opening in the etch stop layer and the first dielectric layer to expose a portion of the source/drain contact;
forming a spacer structure in the opening, wherein the spacer structure comprises an air gap, wherein the forming the spacer structure comprises:
forming a first spacer layer over the etch stop layer, the first dielectric layer and the source/drain contact;
forming a dummy spacer layer over the first spacer layer;
removing horizontal portions of the dummy spacer layer to expose a portion of the first spacer layer;
forming a second spacer layer over the dummy spacer layer and the exposed first spacer layer; and
removing a portion of the first spacer layer and a portion of the second spacer layer to expose a portion of the source/drain contact; and
forming a source/drain conductive layer in the opening over the source/drain contact, wherein the spacer structure surrounds the source/drain conductive layer.

18. The method for fabricating the semiconductor device structure of claim 17, after forming the source/drain conductive layer in the opening over the source/drain contact, further comprising:
removing the dummy spacer layer to form the air gap; and
forming a seal layer to seal the air gap.

19. The method for fabricating the semiconductor device structure of claim 18, wherein forming the seal layer to seal the air gap comprises:
   forming the seal layer over the etch stop layer, the first spacer layer, the air gap, the second spacer layer and the source/drain conductive layer, wherein a portion of the seal layer partially fills the air gap; and
   performing a planarization process to remove portions of the seal layer disposed over the etch stop layer, the first spacer layer, the second spacer layer and the source/drain conductive layer.

20. The method for fabricating the semiconductor device structure of claim 17, wherein forming the source/drain conductive layer in the opening over the source/drain contact comprises:
   forming a glue layer over the etch stop layer, the first spacer layer, the dummy spacer layer and the second spacer layer, wherein the glue layer is over the source/drain contact;
   forming the source/drain conductive layer on the glue layer; and
   performing a planarization process to remove portions of the glue layer and the source/drain conductive layer disposed over the etch stop layer, the first spacer layer, the dummy spacer layer and the second spacer layer.

* * * * *